United States Patent
Kim et al.

(10) Patent No.: US 11,133,362 B2
(45) Date of Patent: Sep. 28, 2021

(54) DISPLAY DEVICE

(71) Applicant: SAMSUNG DISPLAY CO., LTD., Yongin-si (KR)

(72) Inventors: Kwangmin Kim, Yongin-si (KR); Wonkyu Kwak, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/931,130

(22) Filed: Jul. 16, 2020

(65) Prior Publication Data
US 2020/0350379 A1    Nov. 5, 2020

Related U.S. Application Data

(63) Continuation of application No. 16/296,700, filed on Mar. 8, 2019, now Pat. No. 10,734,459, which is a
(Continued)

(30) Foreign Application Priority Data

Mar. 8, 2018 (KR) .................. 10-2018-0027701
Mar. 7, 2019 (KR) .................. 10-2019-0026475

(51) Int. Cl.
*H01L 27/32* (2006.01)
*H01L 51/50* (2006.01)
(Continued)

(52) U.S. Cl.
CPC ...... *H01L 27/3246* (2013.01); *H01L 27/3258* (2013.01); *H01L 27/3276* (2013.01);
(Continued)

(58) Field of Classification Search
CPC ............ H01L 27/3246; H01L 27/3276; H01L 27/3258; H01L 51/5253; H01L 51/502; H01L 51/0097
See application file for complete search history.

(56) References Cited

U.S. PATENT DOCUMENTS 9,412,972 B2   8/2016  Shim et al.
9,954,200 B2   4/2018  Kim et al.
(Continued)

FOREIGN PATENT DOCUMENTS

KR   10-2015-0025994   3/2015
KR   10-2016-0032800   3/2016
(Continued)

*Primary Examiner* — Kyoung Lee
*Assistant Examiner* — Christina A Sylvia
(74) *Attorney, Agent, or Firm* — F. Chau & Associates, LLC

(57) ABSTRACT

A display device includes a substrate including a display area, a peripheral area, and a pad area, first and second voltage lines, and an island dam. The first voltage line is disposed between a first side of the display area and the pad area, the second voltage line is disposed at other sides of the display area, and the island dam is disposed between the display area and the pad area. The first voltage line includes a first main voltage line, and a first connection unit that protrudes from the first main voltage line and extends toward the pad area. The second voltage line includes a second main voltage line, and a second connection unit that protrudes from an end of the second main voltage line and extends toward the pad area. The island dam extends substantially parallel to the first main voltage line.

16 Claims, 9 Drawing Sheets

Related U.S. Application Data continuation-in-part of application No. 16/176,408, filed on Oct. 31, 2018, now abandoned.

(51) Int. Cl.
*H01L 51/52* (2006.01)
*H01L 51/00* (2006.01)

(52) U.S. Cl.
CPC ........ *H01L 51/0097* (2013.01); *H01L 51/502* (2013.01); *H01L 51/5253* (2013.01)

(56) References Cited

U.S. PATENT DOCUMENTS

| | | | | |
|---|---|---|---|---|
| 2014/0302627 A1* | 10/2014 | Ko | ...................... | C09K 11/025 |
| | | | | 438/35 |
| 2015/0053935 A1 | 2/2015 | Gupta et al. | | |
| 2016/0293884 A1* | 10/2016 | Zhang | ................... | H05B 45/60 |
| 2017/0033312 A1* | 2/2017 | Kim | ................... | H01L 27/3276 |
| 2017/0309651 A1 | 10/2017 | Kim et al. | | |
| 2018/0097200 A1 | 4/2018 | Park et al. | | |
| 2019/0280065 A1 | 9/2019 | Kim et al. | | |

FOREIGN PATENT DOCUMENTS

| | | |
|---|---|---|
| KR | 10-2016-0076006 | 6/2016 |
| KR | 10-2017-0090382 | 8/2017 |
| KR | 10-2017-0121392 | 11/2017 |

\* cited by examiner

DISPLAY DEVICE

CROSS-REFERENCE TO RELATED APPLICATIONS

This application is a continuation application of U.S. patent application Ser. No. 16/296,700 filed Mar. 8, 2019, which is a continuation-in-part application of U.S. Ser. No. 16/176,408, filed on Oct. 31, 2018, which claims priority under 35 U.S.C. § 119 to Korean Patent Application No. 10-2018-0027701, filed on Mar. 8, 2018, the disclosures of which are incorporated by reference herein in their entireties. This application further claims priority to Korean Patent Application No. 10-2019-0026475, filed on Mar. 7, 2019, the disclosure of which is incorporated by reference herein in its entirety.

TECHNICAL FIELD

Exemplary embodiments of the present disclosure relate to a display device.

DISCUSSION OF THE RELATED ART

An organic light-emitting display device includes an organic light-emitting element including a hole injection electrode, an electron injection electrode, and an organic emission layer formed therebetween. Organic light-emitting display devices are self-emission display devices in which a hole injected from the hole injection electrode and an electron injected from the electron injection electrode are combined in the organic emission layer such that an exciton is generated from the combination and emits light when the exciton transitions from an exited state to a ground state.

Organic light-emitting display devices do not require a separate light source such as a backlight, may be driven by low voltages, and may have a lightweight and thin structure. In addition, organic light-emitting display devices have high quality characteristics such as a wide viewing angle, high contrast, and a short response time. As a result, the use of organic light-emitting display devices is increasing. However, the performance of an organic light-emitting display device may be degraded if moisture or oxygen from outside of the display device permeates into the display device.

SUMMARY

Exemplary embodiments of the present disclosure relate to an improved display device capable of preventing moisture or oxygen from entering into the display device from the outside.

According to an exemplary embodiment of the present disclosure, a display device includes a substrate, a first voltage line, a second voltage line, and an island dam. The substrate includes a display area, a peripheral area disposed at a periphery of the display area, and a pad area disposed in the peripheral area. The first voltage line is disposed in the peripheral area between a first side of the display area and the pad area. The second voltage line is disposed at other sides of the display area. The island dam is disposed between the display area and the pad area. The island dam is disposed on a layer lower than the first voltage line and the second voltage line. The first voltage line includes a first main voltage line and a first connection unit. The first connection unit protrudes from the first main voltage line and extends toward the pad area. The second voltage line includes a second main voltage line and a second connection unit. The second connection unit protrudes from an end of the second main voltage line and extends toward the pad area. The island dam extends substantially parallel to the first main voltage line.

In an exemplary embodiment, the island dam is disposed between the first connection unit and the second connection unit, a first end of the island dam overlaps the first connection unit, and a second end of the island dam that opposes the first end overlaps the second connection unit.

In an exemplary embodiment, the substrate further includes a bending area disposed between the display area and the pad area. An inorganic insulating layer stacked on the substrate includes a groove formed at a position corresponding to the bending area. An organic material layer is disposed in the groove. The island dam includes a same material as the organic material layer.

In an exemplary embodiment, the display device further includes a thin film transistor disposed in the display area, a display element electrically connected to the thin film transistor, a planarization insulating layer disposed between the thin film transistor and the display element, a first dam disposed in the peripheral area, and a second dam disposed in the peripheral area. The first dam and the second dam are separate from the planarization insulating layer, and the island dam overlaps at least one of the first dam and the second dam.

In an exemplary embodiment, the island dam is disposed below the first dam and the second dam, and a height of at least one of the first dam and the second dam increases at a location at which the at least one of the first dam and the second dam overlaps the island dam.

In an exemplary embodiment, the display device further includes a thin film transistor disposed in the display area, a display element electrically connected to the thin film transistor, an encapsulation layer sealing the display element, and an inorganic protection layer disposed between the island dam and the encapsulation layer.

In an exemplary embodiment, the encapsulation layer includes a first inorganic encapsulation layer, an organic encapsulation layer, and a second inorganic encapsulation layer consecutively stacked. The first inorganic encapsulation layer directly contacts the inorganic protection layer at a position at which the first inorganic encapsulation layer overlaps the island dam.

In an exemplary embodiment, the display area further includes a data line that provides data signals to the thin film transistor, and the inorganic protection layer covers the data line.

In an exemplary embodiment, the display device further includes a planarization insulating layer disposed between the thin film transistor and the display element, and a first dam separate from the planarization insulating layer and surrounding the display area. The inorganic protection layer covers the first connection unit and the second connection unit between the planarization insulating layer and the first dam.

In an exemplary embodiment, the display device further includes a thin film transistor disposed in the display area, a display element electrically connected to the thin film transistor, a planarization insulating layer disposed between the thin film transistor and the display element, a first dam disposed in the peripheral area, and a second dam disposed in the peripheral area. The first dam and the second dam are separate from the planarization insulating layer. The island dam is disposed between the display area and the second dam.

According to an exemplary embodiment of the present disclosure, a display device includes a substrate including a display area, a peripheral area disposed at a periphery of the display area, a pad area disposed in the peripheral area, and a bending area disposed between the display area and the pad area. The display device further includes a thin film transistor disposed in the display area, a display element electrically connected to the thin film transistor, a data line that provides data signals to the thin film transistor, an inorganic protection layer that covers the data line, a first voltage line disposed in the peripheral area, and a second voltage line disposed in the peripheral area. The first voltage line and the second voltage line provide driving voltages to the display element. The display device further includes an island dam disposed between the display area and the pad area, an encapsulation layer that seals the display element, an inorganic insulating layer disposed on the substrate and including a groove formed at a position corresponding to the bending area, and an organic material layer disposed in the groove. The island dam includes a same material as the organic material layer, and the inorganic protection layer is disposed between the island dam and the encapsulation layer.

In an exemplary embodiment, the first voltage line includes a first main voltage line disposed between a first side of the display area and the pad area, and a first connection unit protruding from the first main voltage line and extending toward the pad area. Further, the second voltage line includes a second main voltage line disposed at other sides of the display area, and a second connection unit protruding from an end of the second main voltage line and extending toward the pad area. The island dam is disposed on a layer lower than the first voltage line and the second voltage line, and extends substantially parallel to the first main voltage line. The island dam overlaps the first connection unit and the second connection unit.

In an exemplary embodiment, the island dam is disposed between the first connection unit and the second connection unit, a first end of the island dam overlaps the first connection unit, and a second end of the island dam that opposes the first end overlaps the second connection unit.

In an exemplary embodiment, the inorganic insulating layer covers the first connection unit, the second connection unit, and the island dam in an area exposed between the first connection unit and the second connection unit.

In an exemplary embodiment, the display device further includes a planarization insulating layer disposed between the thin film transistor and the display element, a first dam disposed in the peripheral area, and a second dam disposed in the peripheral area.

In an exemplary embodiment, the island dam is disposed between the display area and the second dam.

In an exemplary embodiment, the island dam overlaps at least one of the first dam and the second dam.

In an exemplary embodiment, the island dam is disposed on a layer lower than the first dam and the second dam.

In an exemplary embodiment, the encapsulation layer includes a first inorganic encapsulation layer, an organic encapsulation layer, and a second inorganic encapsulation layer consecutively stacked. The first inorganic encapsulation layer directly contacts the inorganic protection layer at a position at which the first inorganic encapsulation layer overlaps the island dam.

In an exemplary embodiment, the first inorganic encapsulation layer and the second inorganic encapsulation layer contact each other outside the organic encapsulation layer, and the first inorganic encapsulation layer and the second inorganic encapsulation layer extend outside of the first dam.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF THE EXEMPLARY EMBODIMENTS

Figure 1:
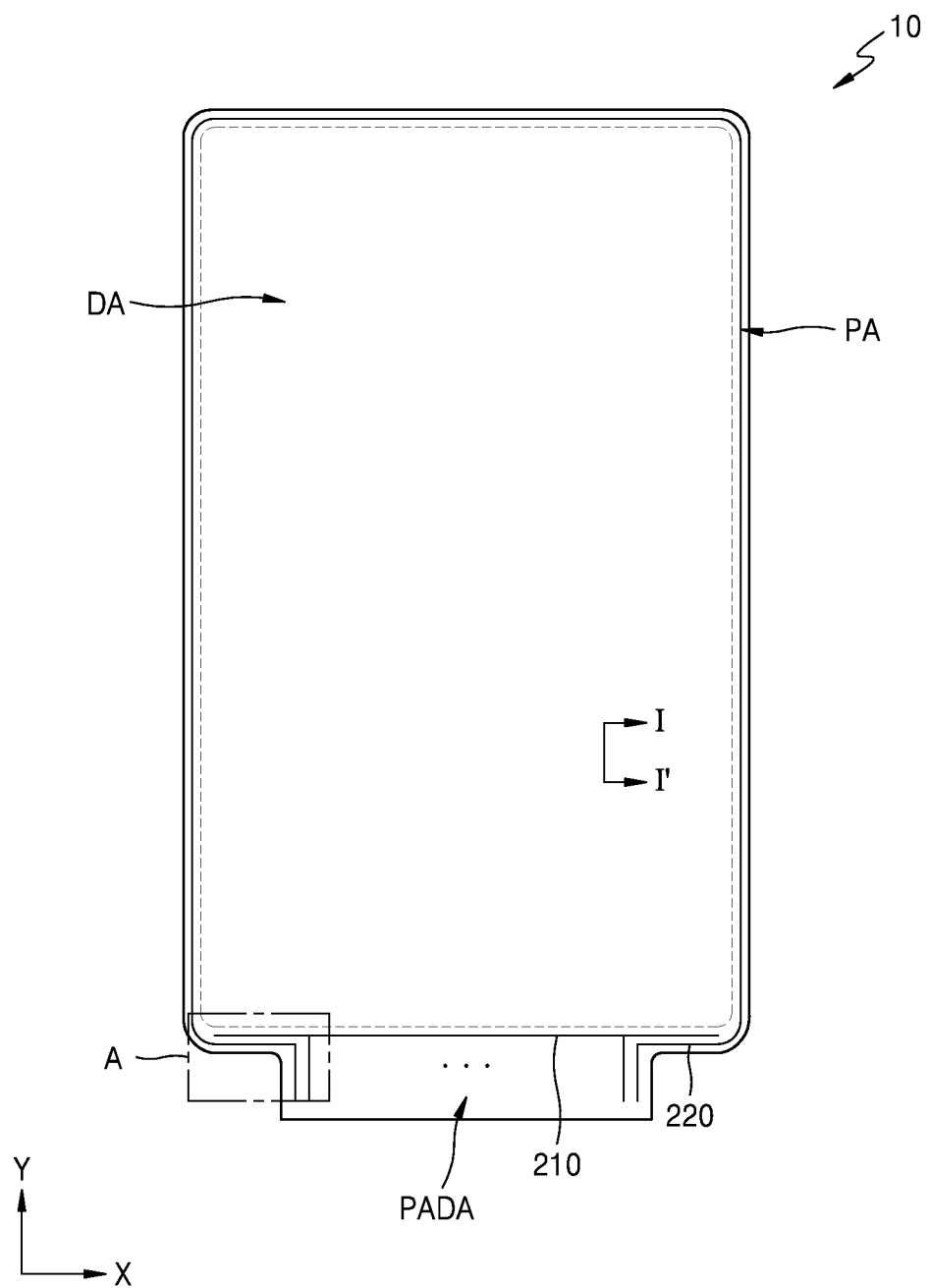
FIG. 1 is a plan view schematically showing an example of a display device according to an exemplary embodiment of the present disclosure.

Exemplary embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

The singular forms "a", "an", and "the" are intended to include the plural forms as well, unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 2:
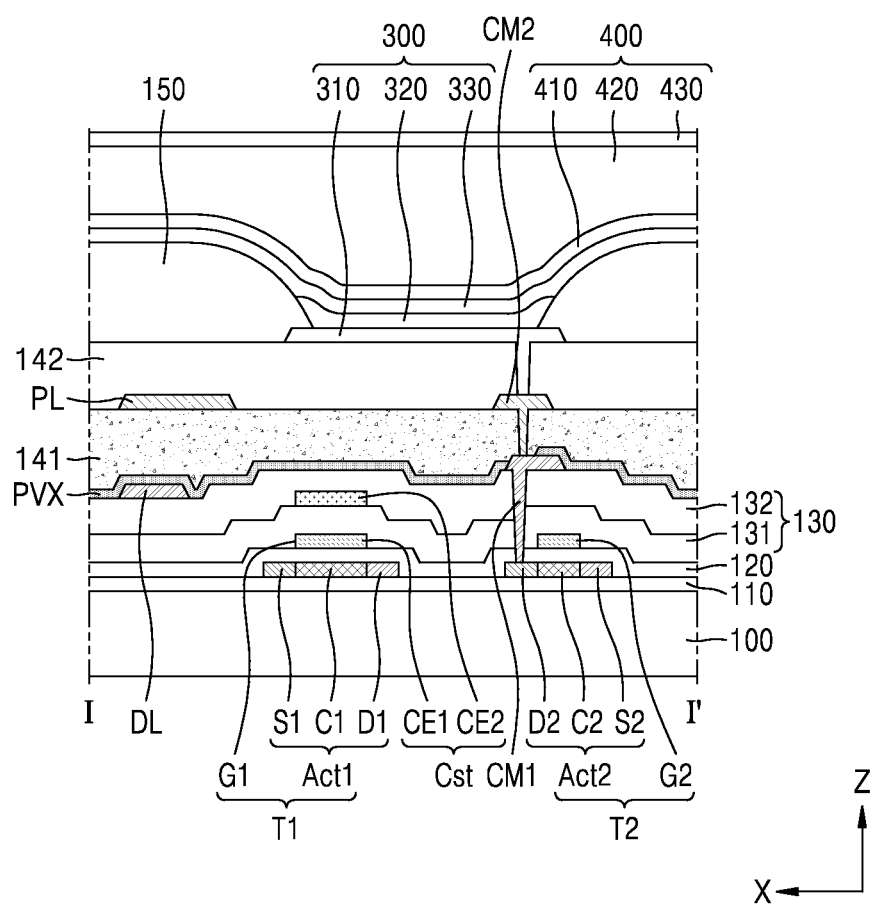
FIG. 2 is a cross-sectional view schematically showing an example of a cross-section of the display device taken along line I-I' shown in FIG. 1.
Figure 3:
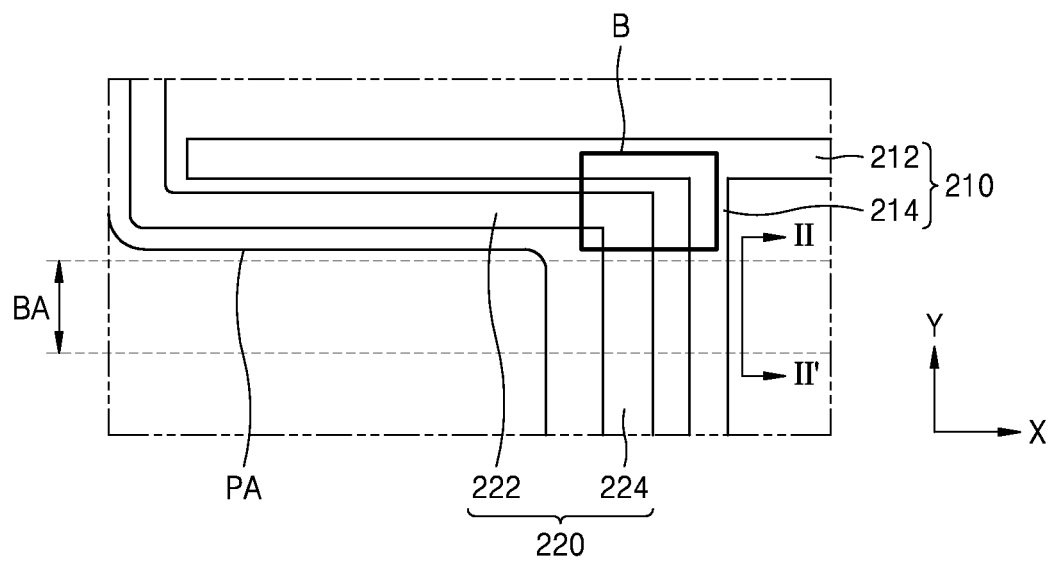
FIG. 3 is a plan view schematically showing region A of the display device shown in FIG. 1.
Figure 4:
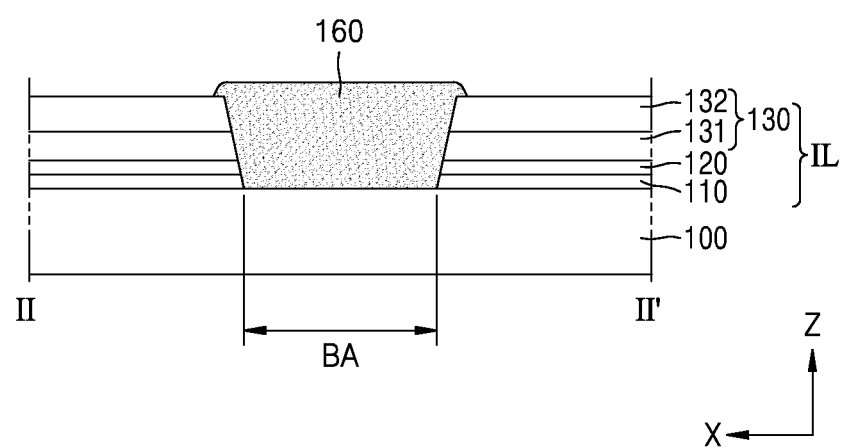
FIG. 4 is a cross-sectional view schematically showing an example of a cross-section of the display device taken along line II-II' shown in FIG. 3.

FIG. 1 is a plan view schematically showing an example of a display device 10 according to an exemplary embodiment of the present disclosure. FIG. 2 is a cross-sectional view schematically showing an example of a cross-section of the display device taken along line I-I' shown in FIG. 1. FIG. 3 is a plan view schematically showing region A of the display device shown in FIG. 1. FIG. 4 is a cross-sectional view schematically showing an example of a cross-section of the display device taken along line II-IF shown in FIG. 3.

The display device 10 includes a display area DA, in which a plurality of pixels are disposed, and a peripheral area PA located at a periphery of the display area DA. The plurality of pixels is not disposed in the peripheral area PA. A substrate 100 includes the display area DA and the peripheral area PA. The peripheral area PA includes a pad area PADA. The pad area PADA is an area in which various electronic devices or printed circuit boards are electrically attached, and a first voltage line 210 and a second voltage line 220 are disposed.

FIG. 1 may also be understood as a plan view illustrating an image of, for example, the substrate 100, in a process of manufacturing the display device 10. In the display device 10 to be finally manufactured, or electronic devices such as smartphones including the display device 10, to minimize or reduce the width of the peripheral area PA visible to a user, a part of the substrate 100 or other components may be bent.

For example, as shown in FIG. 3, a bending area BA may, by being included in the peripheral area PA, be located between the pad area PADA and the display area DA. In this case, by bending the substrate 100 in the bending area BA, at least a part of the pad area DA may overlap the display area DA. A bending direction is set such that the pad area PADA is arranged behind the display area DA instead of concealing the display area DA. Accordingly, the user recognizes that the display area DA occupies most of the display device 10.

The substrate 100 may include various flexible or bendable materials such as, for example, high molecular resins such as polyether sulfone (PES), polyacrylate, polyether imide (PEI), polyethylene naphthalate (PEN), polyethylene terephthalate (PET), polyphenylene sulfide (PPS), polyarylate (PAR), polyimide (PI), or cellulose acetate propionate (CAP). A structure of the substrate 100 may be variously modified. For example, the substrate 100 may have a multistack layer structure including two layers respectively including the aforementioned high molecular resins and a barrier layer, which is disposed between the two layers, including inorganic materials (for example, silicon oxide, silicon nitride, silicon oxynitride, etc.).

A pixel in the display area DA includes an display element. The display element may be, for example, an organic light-emitting device 300. However, the display element is not limited thereto. In an exemplary embodiment, the display area DA includes a first thin film transistor T1, a second thin film transistor T2, the organic light-emitting device 300, and a first planarization insulating layer 141 and a second planarization insulating layer 142 disposed between the first thin film transistor T1, the second thin film transistor T2, and the organic light-emitting device 300 (see FIG. 2). A structure of the pixel is described in more detail with reference to FIG. 2.

In an exemplary embodiment, the organic light-emitting device 300 is electrically connected to the first thin film transistor T1, the second thin film transistor T2, and a storage capacitor Cst. The first thin film transistor T1 includes a first semiconductor layer Act1 and a first gate electrode G1, and the second thin film transistor T2 includes a second semiconductor layer Act2 and a second gate electrode G2.

The first semiconductor layer Act1 and the second semiconductor layer Act2 may include, for example, amorphous silicon, polycrystalline silicon, oxide semiconductors, or organic semiconductor materials. In an exemplary embodiment, the first semiconductor layer Act1 includes a first channel area C1, a first source area S1, and a first drain area D1. The first source area S1 and the first drain area D1 are disposed respectively at two opposite sides of the first channel area C1. In an exemplary embodiment, the second semiconductor layer Act2 includes a second channel area C2, a second source area S2, and a second drain area D2. The second source area S2 and the second drain area D2 are disposed respectively at two opposite sides of the second channel area C2.

The first source area S1 and the first drain area D1 of the first semiconductor layer Act1 may respectively be understood as a source electrode and a drain electrode of the first thin film transistor T1. The second source area S2 and the second drain area D2 of the second semiconductor layer Act2 may respectively be understood as a source electrode and a drain electrode of the second thin film transistor T2.

In an exemplary embodiment, the first gate electrode G1 and the second gate electrode G2 are disposed to respectively overlap the first channel area C1 of the first semiconductor layer Act1 and the second channel area C2 of the second semiconductor layer Act2. A gate insulating layer 120 is disposed between the first gate electrode G1 and the second gate electrode G2. Each of the first gate electrode G1 and the second gate electrode G2 may be, for example, a single layer or a multistack layer formed from conductive materials including at least one of, for example, molybdenum (Mo), aluminum (Al), copper (Cu), and titanium (Ti).

In the exemplary embodiment of FIG. 2, the first gate electrode G1 and the second gate electrode G2 are disposed on the same layer. However, exemplary embodiments of the present disclosure are not limited thereto. For example, in an exemplary embodiment, the first gate electrode G1 and the second gate electrode G2 are disposed on two different layers. Further, in the exemplary embodiment of FIG. 2, the display device 10 is illustrated as a top-gate type display device in which the first gate electrode G1 and the second gate electrode G2 are respectively disposed above the first semiconductor layer Act1 and the second semiconductor layer Act2. However, exemplary embodiments of the present disclosure are not limited thereto. For example, in an exemplary embodiment, the display device 10 is a bottom-gate type display device in which the first gate electrode G1 and the second gate electrode G2 are respectively disposed below the first semiconductor layer Act1 and the second semiconductor layer Act2.

In an exemplary embodiment, the storage capacitor Cst includes a first storage capacitor electrode CE1 and a second storage capacitor electrode CE2. The first storage capacitor electrode CE1 and the second storage capacitor electrode CE2 overlap each other. The first storage capacitor electrode CE1 and the second storage capacitor electrode CE2 may respectively include low resistance conductive materials including at least one of, for example, Mo, Al, Cu, and Ti.

In an exemplary embodiment, the storage capacitor Cst overlaps the first thin film transistor T1. The first thin film transistor T1 may be a driving thin film transistor. Although FIG. 2 illustrates an exemplary embodiment in which the storage capacitor Cst overlaps the first thin film transistor T1 and the first storage capacitor electrode CE1 is the first gate electrode G1 of the first thin film transistor T1, exemplary embodiments of the present disclosure are not limited thereto. For example, in an exemplary embodiment, the storage capacitor Cst does not overlap the first thin film transistor T1.

In an exemplary embodiment, a buffer layer 110 is disposed between the substrate 100 and the first and second thin film transistors T1 and T2. The buffer layer 110 may include inorganic insulating materials. For example, the buffer layer 110 may be a single-layer or a multistack layer including at least one of silicon oxynitride, silicon oxide, and silicon nitride.

In an exemplary embodiment, the gate insulating layer 120 is disposed between the first gate electrode G1, the second gate electrode G2, the first semiconductor layer Act1, and the second semiconductor layer Act2. The gate insulating layer 120 may include an inorganic insulating material. For example, the gate insulating layer 120 may be a single-layer or a multistack layer including at least one of silicon oxynitride, silicon oxide, and silicon nitride.

In an exemplary embodiment, the first thin film transistor T1 and the second thin film transistor T2 are covered by an interlayer insulating layer 130. In FIG. 2, the interlayer insulating layer 130 is illustrated as including a first interlayer insulating layer 131 and a second interlayer insulating layer 132. According to exemplary embodiments, the first interlayer insulating layer 131 is disposed directly on the first thin film transistor T1 and the second thin film transistor T2, and/or directly on the first storage capacitor electrode CE1. The second interlayer insulating layer 132 is disposed on the second storage capacitor electrode CE2. Each of the first interlayer insulating layer 131 and the second interlayer insulating layer 132 may be, for example, a single-layer or a multistack layer including at least one of silicon oxynitride, silicon oxide, and silicon nitride. For example, the first interlayer insulating layer 131 may be a single-layer formed from silicon nitride, and the second interlayer insulating layer 132 may be a multistack layer formed from silicon nitride and silicon oxide.

In an exemplary embodiment, a data line DL is disposed on the interlayer insulating layer 130. The data line DL is electrically connected to a switching thin film transistor and provides data signals thereto. The data line DL may be, for example, a single-layer or a multistack layer including at least one from among Al, Cu, Ti, and alloys thereof. In an exemplary embodiment, the data line DL is a triple-layer having a structure of Ti/Al/Ti.

In an exemplary embodiment, the data line DL is covered by an inorganic protection layer PVX. The inorganic protection layer PVX may be, for example, a single-layer or a multistack layer formed of silicon nitride (SiNx) and silicon oxide (SiOx). The inorganic protection layer PVX covers and protects wires exposed in the peripheral area PA. For example, in a part of the substrate 100 (for example, a part of the peripheral area PA), wires simultaneously formed in the same process as that of forming the data line DL may be exposed. Although exposed parts of the wires may be damaged due to an etchant used for patterning a pixel electrode 310 to be described below, since the inorganic protection layer PVX covers the data line DL and part of the wires simultaneously formed with the data line DL, the wires may be protected from damage during patterning of the pixel electrode 310.

In an exemplary embodiment, a driving voltage line PL and the data line DL are disposed on two different layers. Herein, the phrase "A and B are arranged/disposed on two different layers" indicates a case in which at least one insulating layer is provided between A and B, and between A and B, one is arranged under the at least one insulating layer and another is arranged on the at least one insulating layer. In an exemplary embodiment, the first planarization insulating layer 141 is disposed between the driving voltage line PL and the data line DL.

The driving voltage line PL may be, for example, a single-layer or a multistack layer including at least one of Al, Cu, Ti, and alloys thereof. For example, the driving voltage line PL may be a triple-layer having a structure of Ti/Al/Ti. Although FIG. 2 illustrates a configuration in which the driving voltage line PL is disposed only on the first planarization insulating layer 141, exemplary embodiments of the present disclosure are not limited thereto. For example, in an exemplary embodiment, the driving voltage line PL is connected to a lower additional voltage line formed together with the data line DL through a penetration hole formed in the first planarization insulating layer 141. As a result, a resistance of the driving voltage line PL may be reduced.

In an exemplary embodiment, the second planarization insulating layer 142 covers the driving voltage line PL. The first planarization insulating layer 141 and the second planarization insulating layer 142 may include organic materials. The organic materials may include, for example, PI, commercial polymers such as polymethylmethacrylate (PMMA), polystyrene (PS), high molecular derivatives having a phenolic group, acrylic polymer, aryl ether polymer, amide polymer, fluoride polymer, p-xylene polymer, vinyl alcohol polymer, and blends thereof.

In an exemplary embodiment, the organic light-emitting device 300 is disposed on the second planarization insulating layer 142. The organic light-emitting device 300 includes the pixel electrode 310, an opposite electrode 330, and an intermediate layer 320 disposed between the pixel electrode 310 and the opposite electrode 330 and that includes an emission layer.

In an exemplary embodiment, a pixel defining layer 150 is disposed on the pixel electrode 310. The pixel defining layer 150 defines pixels by including an opening corresponding to each pixel, in which the opening exposes at least a central part of the corresponding pixel electrode 310. In an exemplary embodiment, the pixel defining layer 150 increases distances between edges of the pixel electrode 310 and the opposite electrode 330, thereby preventing arcs from occurring between the edges of the pixel electrode 310 and the opposite electrode 330. The pixel defining layer 150 may, for example, be formed from organic materials including PI, hexamethyldisiloxane, etc.

In an exemplary embodiment, the pixel electrode 310 is connected to a pixel circuit including the first thin film transistor T1, the second thin film transistor T2, and the storage capacitor Cst through a first connection metal CM1 and a second connection metal CM2.

The intermediate layer 320 may include a low molecular material or a polymer material. When the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), etc. are singularly or multiply stacked. The low molecular material may include various organic materials such as, for example, copper phthalocyanine (CuPc), N,N'-Di(naphthalene-1-yl)-N,N'-diphenyl-benzidine (NPB), or tris-8-hydroxyquinoline aluminum (Alq3). These layers may be formed by using a vacuum deposition method.

When the intermediate layer 320 includes a polymer material, the intermediate layer 320 may generally have a structure including an HTL and an EML. In this case, the HTL may include Poly(3,4-ethylenedioxythiophene) (PEDOT), and the EML may include polymer materials such as, for example, poly-phenylenevinylene (PPV) and polyfluorene. However, the structure of the intermediate layer 320 is not limited to the above-described configuration, and the intermediate layer 320 may have any one of various structures. For example, in exemplary embodiments, the intermediate layer 320 may include a one-body layer corresponding to a plurality of pixel electrodes, each being identical to the pixel electrode 310, or layers patterned to respectively correspond to the plurality of pixel electrodes 310.

Meanwhile, in the present embodiment, the intermediate layer 320, for example, the emission layer EML, may include a quantum dot (QD) material. A core of the QD may be selected from Group II-IV compounds, Group III-V compounds, Group IV-VI compounds, Group IV elements, Group IV compounds, and combinations thereof.

Group II-IV compounds may be selected from among two-element compounds, three-element compounds, and four-element compounds. The two-element compounds may be selected from CdSe, CdTe, ZnS, ZnSe, ZnTe, ZnO, HgS, HgSe, HgTe, MgSe, MgS and combinations thereof, the three-element compounds may be selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and combinations thereof, and the four-element compounds may be selected from HgZnTeS, CdZnSeS, CdZnSeTe, CdZnSTe, CdHgSeS, CdHgSeTe, CdHgSTe, HgZnSeS, HgZnSeTe, HgZnSTe and combinations thereof.

Group III-V compounds may be selected from among two-element compounds, three-element compounds, and four-element compounds. The two-element compounds may be selected from among GaN, GaP, GaAs, GaSb, AN, AlP, AlAs, AlSb, InN, InP, InAs, InSb and combinations thereof, the three-element compounds may be selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP and combinations thereof, and the four-element compounds may be selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and combinations thereof.

Group IV-VI compounds may be selected from among two-element compounds, three-element compounds, and four-element compounds. The two-element compounds may be selected from among SnS, SnSe, SnTe, PbS, PbSe, PbTe and combinations thereof, the three-element compounds may be selected from SnSeS, SnSeTe, SnSTe, PbSeS, PbSeTe, PbSTe, SnPbS, SnPbSe, SnPbTe and combinations thereof, and the four-element compounds may be selected from SnPbSSe, SnPbSeTe, SnPbSte and combinations thereof. The Group IV elements may be selected from Si, Ge and a combination thereof. The group IV compounds may be two-element compounds selected from SiC, SiGe, and combinations thereof.

In this case, the two-element compounds, three-element compounds, or four-element compounds may exist in the particle in a same concentration or separated to have partially different concentrations and exist in one same particle. In addition, the QD may have a core-shell structure in which one quantum dot covers another quantum dot. An interface between the core and the shell may have a concentration gradient in which the concentration of elements in the shell decreases toward the center.

In some embodiments, the QD may have a core-shell structure including the above-mentioned nanoparticles and a shell surrounding the core. The shell of the QD may function as a protection layer for preventing chemical denaturalization to maintain semiconductor characteristics and/or a charging layer for providing electrophoretic characteristics to the QD. The shell may include a single layer or a multi-layer. The interface between the core and the shell may have a concentration gradient in which the concentration of elements in the shell decreases toward the center. The shell of the QD may, for example, include a metal oxide or a non-metal oxide, a semiconductor compound, or combinations thereof.

For example, the metal oxide or the non-metal oxide may include two-element compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO or three-elements such as $MgAl_2O_4$, $CoFe_2O_4$, $NiFe_2O_4$, $CoMn_2O_4$, but the present disclosure is not limited thereto.

In addition, the semiconductor compound may, for example, include CdS, CdSe, CdTe, ZnS, ZnSe, znTe, ZnSeS, ZnTeS, GaAs, GaP, GaSb, HgS, HgSe, HgTe, InAs, InP, InGaP, InSb, AlAs, AlP, AlSb, but the present disclosure is not limited thereto.

The QD may have a full width of half maximum (FWHM) less than or equal to about 45 nm, preferably less than equal to about 40 nm, or even more preferably less than or equal to about 30 nm, and color purity or color reproductive function may be enhanced in the above-mentioned range. In addition, as light emitted through the QD is irradiated toward every direction, viewing angle of the light may be enlarged.

In addition, the form of the QD is not limited to the form generally used in the field, but more particularly, the form of the QD may be a nanoparticle, being spherical, pyramidal, multi-armed, or cubical, a nanotube, a nanowire, a nano fiber, a nano laminar particle, and the like.

Color of light emitted through the QD may be adjusted according to the size of the particles, and accordingly, the QD may emit light having various colors such as blue, red, or green.

In an exemplary embodiment, the opposite electrode 330 covers the display area DA. For example, the opposite electrode 330 may be formed in a one-body type to cover a plurality of organic light-emitting devices that are each identical to the organic light-emitting device 300.

An encapsulation layer 400 is disposed on the opposite electrode 330. The encapsulation layer 400 protects the organic light-emitting devices 300 from moisture or oxygen from outside of the display device 10. For example, the encapsulation layer 400 seals the organic light-emitting devices 300. To protect the organic light-emitting devices 300, the encapsulation layer 400 extends on the display area DA in which the organic light-emitting devices 300 are disposed and on the peripheral area PA at the periphery of the display area DA. The encapsulation layer 400 may, as illustrated in FIG. 2, have a multistack layer structure. For example, in an exemplary embodiment, the encapsulation layer 400 includes a first inorganic encapsulation layer 410, an organic encapsulation layer 420, and a second inorganic encapsulation layer 430 that are sequentially stacked.

The first inorganic encapsulation layer 410 is formed on the opposite electrode 330 and may include, for example, silicon oxide, silicon nitride, and/or silicon oxynitride, etc. The first inorganic encapsulation layer 410 may be formed along a structure disposed under the first inorganic encapsulation layer 410.

In an exemplary embodiment, the organic encapsulation layer 420 is provided on the first inorganic encapsulation layer 410 and is sufficiently thick, resulting in an upper surface of the organic encapsulation layer 420 being substantially flat. The organic encapsulation layer 420 may include, for example, at least one of PET, PEN, polycarbonate, PI, polyethylene sulfonate, polyoxymethylene, PAR, and hexamethyldisiloxane.

The second inorganic encapsulation layer 430 covers the organic encapsulation layer 420. The second inorganic encapsulation layer 430 may include, for example, silicon oxide, silicon nitride, and/or silicon oxynitride, etc. In an exemplary embodiment, the first inorganic encapsulation layer 410 and the second inorganic encapsulation layer 430 have areas greater than the area of the organic encapsulation layer 420, and contact each other outside the organic encapsulation layer 420. Thus, in an exemplary embodiment, the organic encapsulation layer 420 is not exposed to the outside due to the first inorganic encapsulation layer 410 and the second inorganic encapsulation layer 430.

As described above, according to exemplary embodiments of the present disclosure, since the encapsulation layer 400 includes the first inorganic encapsulation layer 410, the organic encapsulation layer 420, and the second inorganic encapsulation layer 430, by using this kind of multiple-layer structure, even if cracks occur in the encapsulation layer 400, the cracks may not be connected between the first inorganic encapsulation layer 410 and the organic encapsulation layer 420, or between the organic encapsulation layer 420 and the second inorganic encapsulation layer 430. Accordingly, in exemplary embodiments, the formation of paths through which moisture or oxygen from outside permeates into the display area DA may be prevented or reduced.

In an exemplary embodiment, the first voltage line 210 and the second voltage line 220 are disposed in the peripheral area PA. Each of the first voltage line 210 and the second voltage line 220 provide a driving voltage to the organic light-emitting devices 300. In addition, in an exemplary embodiment, a bending area BA is established in the peripheral area PA.

For example, in an exemplary embodiment, the first voltage line 210 is a first power voltage (ELVDD) line, and the second voltage line 220 is a second power voltage (ELVSS) line. In an exemplary embodiment, the second voltage line 220 is, either directly or via another wire, connected to the opposite electrode 330.

In an exemplary embodiment, the first voltage line 210 is disposed between a side of the display area DA (e.g., a first side of the display area DA) and the pad area PADA, as shown in FIG. 1. In an exemplary embodiment, the first voltage line 210 includes a first main voltage line 212 and a first connection unit 214. The first main voltage line 212 and the first connection unit 214 are disposed to correspond to the side of the display area DA. For example, when the display area DA is a rectangle, the first main voltage line 212 may be disposed to correspond to an arbitrary side of the display area DA. In an exemplary embodiment, the first main voltage line 212 is substantially parallel to the arbitrary side and has a length greater than the length of the arbitrary side. The arbitrary side corresponding to the first main voltage line 212 is a side adjacent to the pad area PADA.

In an exemplary embodiment, the first connection unit 214 protrudes from the first main voltage line 212 and extend in a first direction. The first direction is a direction extending from the display area DA to the pad area PDAD. The first connection unit 214 may be connected to a pad unit.

In an exemplary embodiment, the second voltage line 220 is disposed at other sides of the display area DA (e.g., the sides of the display area DA at which the first voltage line 210 is not disposed). For example, in an exemplary embodiment, the second voltage line 220 surrounds the remaining sides of the display area DA (e.g., the remaining sides of the display area DA at which the first voltage line 210 is not disposed). For example, referring to the exemplary embodiment of FIG. 1, the display device 10 includes four sides, the first voltage line 210 is disposed between a first side of the display area DA and the pad area PADA, and the second voltage line 220 surrounds the remaining three sides (e.g., the sides other than the first side) of the display area DA. In an exemplary embodiment, the second voltage line 220 includes a second main voltage line 222, corresponding to two opposite ends of the first main voltage line 212 and the rest of the display area DA, and a second connection unit 224 that protrudes from an end of the second main voltage line 222 toward a first direction and extends in the first direction. The first connection unit 214 may be connected to a pad unit.

As described above, exemplary embodiments of the present disclosure include a bending area BA, as shown in FIG. 3. The bending area BA, which is disposed between the display area DA and the pad area PADA, is an area in which parts of the buffer layer 110, the gate insulating layer 120, and the interlayer insulating layer 130 are removed. Hereinafter, the buffer layer 110, the gate insulating layer 120, and the interlayer insulating layer 130 are collectively referred to as an inorganic insulating layer IL. The inorganic insulating layer IL may be understood as a layer including a groove at a position corresponding to the bending area BA (see FIG. 4). By removing a portion of the inorganic insulating layer IL from the bending area BA, a bending operation in the bending area BA may be easily performed and an occurrence of cracks in the inorganic insulating layer IL during the bending operation may be prevented.

In an exemplary embodiment, an area from which the inorganic insulating layer IL is removed is filled with an organic material layer 160.

In an exemplary embodiment, the organic material layer 160, having the bending area BA as a center, extends to non-bending areas adjacent to the bending area BA. The organic material layer 160 may compensate for a height difference of the bending area BA in which the inorganic insulating layer IL is removed, and absorb stress caused by the bending operation. Thus, according to exemplary embodiments of the present disclosure, the concentration of stress caused by the bending operation on various kinds of wires disposed in the bending area BA and used to transmit electrical signals from a pad unit disposed in the pad area PADA to the display area DA is efficiently reduced.

The organic material layer 160 may include, for example, at least one of acryl, metacrylic, polyester, polyethylene, polypropylene, PET, PEN, polycarbonate, polyimide, polyethylene sulfonate, polyoxymethylene, PAR, and hexamethyldisiloxane.

Figure 5:
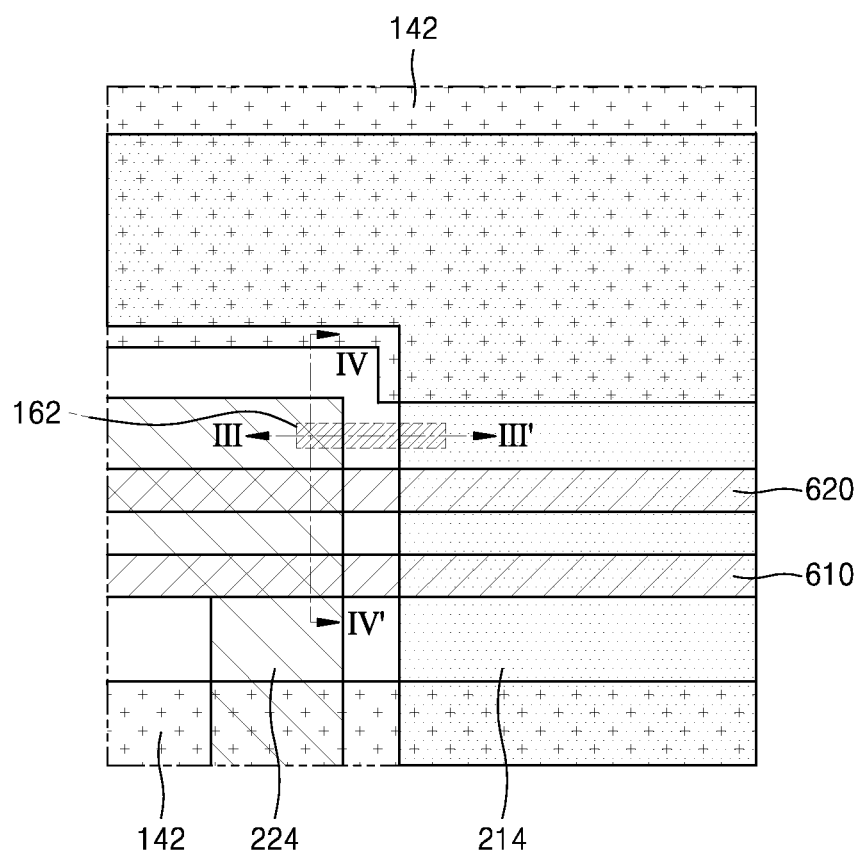
FIG. 5 is a plan view schematically showing region B of the display device shown in FIG. 3.
Figure 6:
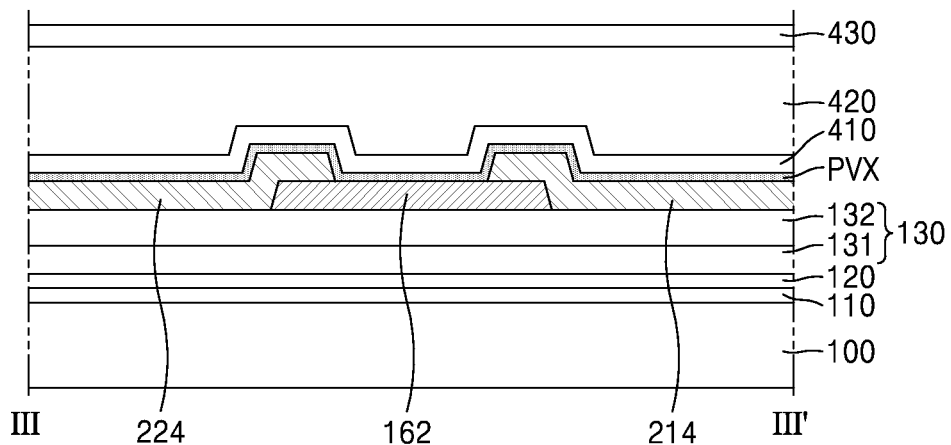
FIG. 6 is a cross-sectional view schematically showing an example of a cross-section of the region B taken along line III-III' shown in FIG. 5.
Figure 7:
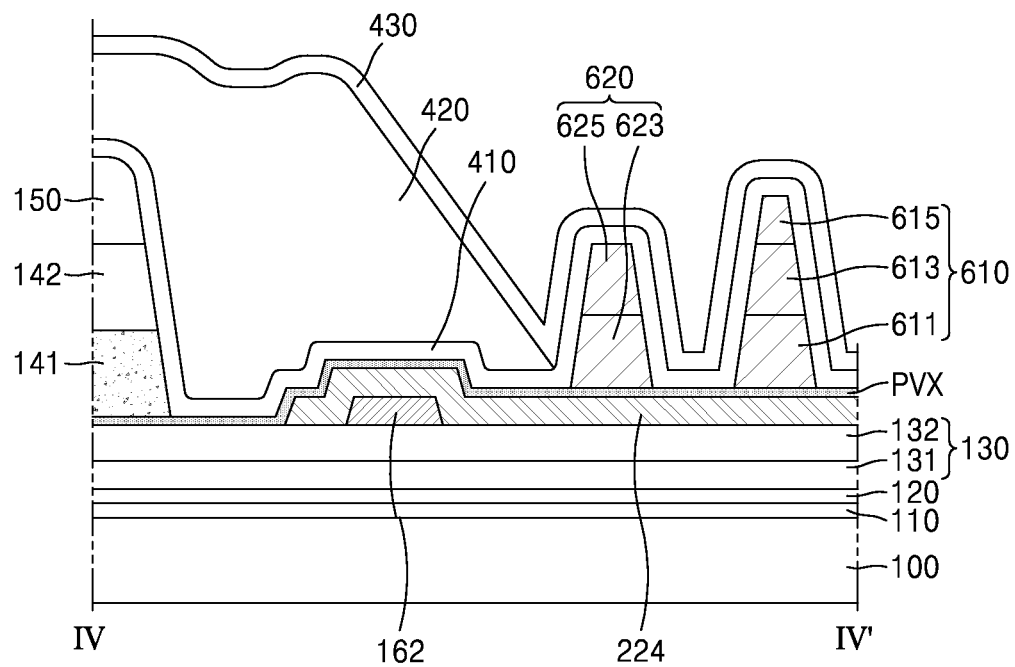
FIG. 7 is a cross-sectional view schematically showing an example of a cross-section of the region B taken along line IV-IV' shown in FIG. 5.

FIG. 5 is a plan view schematically showing an example of region B of the display device shown in FIG. 3. FIG. 6 is a cross-sectional view schematically showing an example of a cross-section of the region B taken along line III-III' shown in FIG. 5. FIG. 7 is a cross-sectional view schematically showing an example of a cross-section of the region B taken along IV-IV' shown in FIG. 5.

First, referring to FIG. 5, in the peripheral area PA (see FIG. 1), a part of the second planarization insulating layer 142 is removed. When a part of the second planarization insulating layer 142 is removed, the first planarization insulating layer 141 (see FIG. 2), which is disposed under the second planarization insulating layer 142, is also removed. Accordingly, when the second planarization insulating layer 142 is described hereinafter, the description of the second planarization insulating layer 142 may also be applied to the first planarization insulating layer 141 (see FIG. 2).

An area from which the second planarization insulating layer 142 is removed surrounds the display area DA. Accordingly, moisture from outside is prevented from permeating into the display area DA through the second planarization insulating layer 142 and the first planarization insulating layer 141 formed from organic materials.

According to exemplary embodiments, although at least the first connection unit 214 and the second connection unit 224 may be exposed in an area from which the second planarization insulating layer 142 is removed, since the inorganic protection layer PVX is formed above the first connection unit 214 and the second connection unit 224, the first connection unit 214 and the second connection unit 224 may be protected from damages during a process of patterning the pixel electrode 310 (see FIG. 2).

According to exemplary embodiments, when forming the encapsulation layer 400 (see FIG. 2), more particularly, when forming the organic encapsulation layer 420, it is defined that a material used to form the organic encapsulation layer 420 is coated in a previously set area. To define the material, as shown in FIG. 5, a first dam 610 may be arranged in the peripheral area PA (see FIG. 1). The first dam 610 is located in the peripheral area PA (see FIG. 1) to be separate from the second planarization insulating layer 142.

The first dam 610 may have a multistack layer structure. For example, as illustrated in FIG. 7, in an exemplary embodiment, the first dam 610 has a structure in which a first layer 611, a second layer 613, and a third layer 615 are consecutively stacked. In an exemplary embodiment, the first layer 611 is formed at the same time and from the same material as the second planarization insulating layer 142, and the second layer 613 is formed at the same time and from the same material as the pixel defining layer 150. The third layer 615 may be additionally formed on the second layer 613 by using the same material as that of the second layer 613.

The first dam 610 supports masks used for forming the intermediate layer 320 (see FIG. 2) of the organic light-emitting device 300 (see FIG. 2) or the opposite electrode 330 (see FIG. 2), and may protect previously formed components from contacting the masks and being damaged. Also, during formation of the organic encapsulation layer 420 on the first inorganic encapsulation layer 410, the first dam 610 may prevent a material used to form the organic encapsulation layer 420 from moving in a direction of an edge of the substrate 100.

As shown in FIG. 7, in an exemplary embodiment, the first inorganic encapsulation layer 410 and the second inorganic encapsulation layer 430 cover the first dam 610 and extend to an area outside the first dam 610. As a result, moisture and oxygen may be more efficiently prevented from permeating the display device 10 from outside.

In an exemplary embodiment, a second dam 620 is formed at a more inner position than the first dam 610. In an exemplary embodiment, the height of the second dam 620 is smaller than the height than the first dam 610, as a result of including an upper layer 623 that may be formed at the same time and from the same material as the second layer 613 of the first dam 610 and a lower layer 625 that may be formed at the same time and from the same material as the third layer 615 of the first dam 610. In an exemplary embodiment, the first dam 610 and the second dam 620 are separate from the planarization insulating layer 142. For example, in exemplary embodiments, the first dam 610 and the second dam 620 are respectively a different component made from a different material than the planarization insulating layer 142.

As described above, according to exemplary embodiments of the present disclosure, by covering the display area DA (see FIG. 1), the first dam 610 and the second dam 620 may prevent the material used to form the organic encapsulation layer 420 from being spread toward edges of the substrate 100. As a result, edge tails may be prevented from being formed at the organic encapsulation layer 420.

However, due to rapid changes in step differences in the area in which the second planarization insulating layer 142 is removed, when the organic encapsulation material (e.g., a liquid organic material) used to form the organic encapsulation layer 420 is coated, reflows of the material used to form the organic encapsulation layer 420 may be more vigorous in the area in which the second planarization insulating layer 142 is removed. Also, as a width of the peripheral area PA is reduced/minimized, a distance between the first dam 610 and the second dam 620 gradually decreases. As a result, it may be difficult to limit a flow of the material used to form the organic encapsulation layer 420. As the material used to form the organic encapsulation layer 420 spreads quicker in a direction toward the pad area PADA (see FIG. 1) along sides of the first connection unit 214 and the second connection unit 224 than in a direction in which the first dam 610 and the second dam 620 are formed, to prevent edge tails from being formed at the organic encapsulation layer 420, the spread of the material used to form the organic encapsulation layer 420 toward the pad area PADA (see FIG. 1) should be interrupted.

To do so, in an exemplary embodiment, an island dam 162 that extends substantially parallel to the first main voltage line 212 is additionally formed. For example, the lengthwise direction of the island dam 162 extends substantially parallel to the first main voltage line 212. The island dam 162 may be partially formed in an area in which the material used to form the organic encapsulation layer 420 has a strong flow. For example, in an exemplary embodiment, the island dam 162 is located between the display area DA (see FIG. 1) and the pad area PADA (see FIG. 1). More particularly, in an exemplary embodiment, the island dam 162 is located in a position such that it simultaneously overlaps the first connection unit 214 and the second connection unit 224. In an exemplary embodiment, the island dam 162 extends in a direction substantially perpendicular to a direction in which the first connection unit 214 and the second connection unit 224 extend. In an exemplary embodiment, two opposite ends of the island dam 162 respectively overlap the first connection unit 214 and the second connection unit 224. For example, in an exemplary embodiment, a first end of the island dam 162 overlaps the first connection unit 214, and a second end of the island dam 162 that is opposite to the first end of the island dam 162 overlaps the second connection unit 224.

In an exemplary embodiment, the island dam 162 includes materials that are the same as those of the aforementioned organic material layer 160 (see FIG. 4). For example, in an exemplary embodiment, the island dam 162 is simultaneously formed with the organic material layer 160 (see FIG. 4) and from the same material as that of the organic material layer 160. Accordingly, in an exemplary embodiment, the island dam 162 is disposed on a layer lower than the first connection unit 214 and the second connection unit 224, and an upper surface of an area between the first connection unit 214 and the second connection unit 224 is covered by the inorganic protection layer PVX.

As described above, when the island dam 162 is formed in an area in which the material used to form the organic encapsulation layer 420 has a strong flow, a resistance is caused in the flow of the material used to form the organic encapsulation layer 420. As a result, according to exemplary embodiments, when the material used to form the organic encapsulation layer 420 is coated, the material used to form the organic encapsulation layer 420 may be efficiently prevented from crossing the first dam 610 and being spread to the edges of the substrate 100.

In an exemplary embodiment, the inorganic protection layer PVX is formed on the island dam 162, and the island dam 162 does not directly contact the first inorganic encapsulation layer 410. For example, since the first inorganic encapsulation layer 410 directly contacts the inorganic protection layer PVX at a position at which the first inorganic encapsulation layer 410 overlaps the island dam 162, a bonding strength of the first inorganic encapsulation layer 410 is not weakened due to contact with the island dam 162 that is formed from an organic material. Accordingly, the island dam 162 may be formed at various positions. For example, although FIG. 5 illustrates an exemplary embodiment in which the island dam 162 is provided in the second dam 620, exemplary embodiments of the present disclosure are not limited thereto. For example, according to exemplary embodiments, a plurality of island dam may be formed at various positions.

FIGS. 8 through 11 are plan views schematically showing exemplary embodiments of region B of the display device shown in FIG. 3. Hereinafter, for convenience of explanation, a further description of elements and processes previously described with reference to FIGS. 5 through 7 may be omitted.

Figure 8:
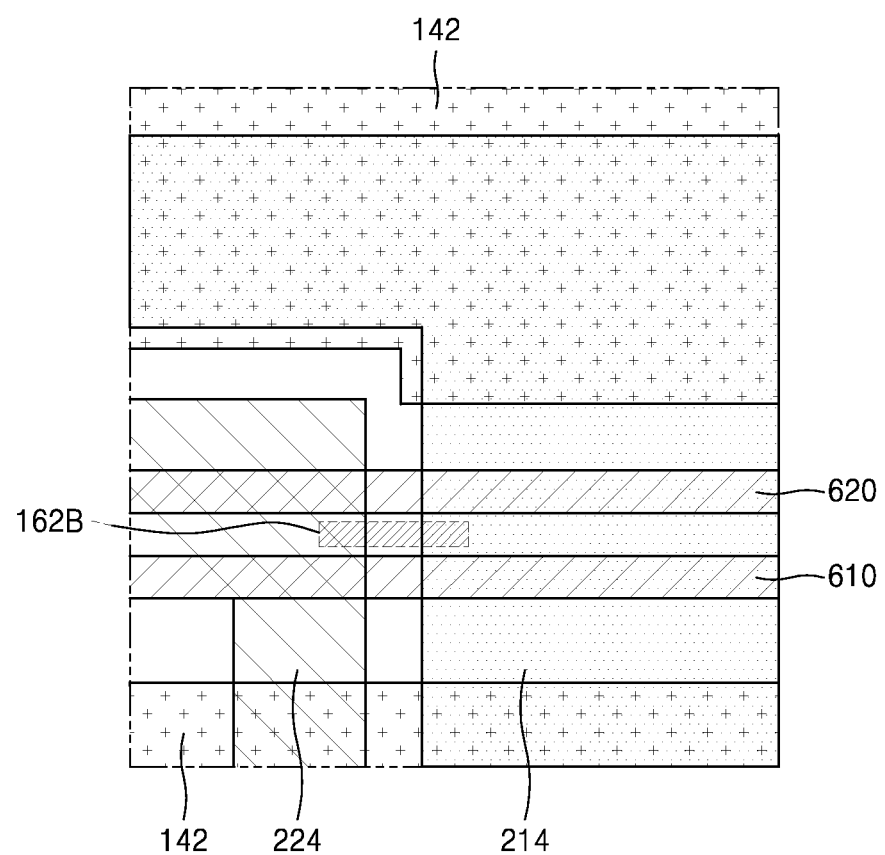
FIGS. 8 through 11 are plan views respectively and schematically showing examples of region B of FIG. 3 according to exemplary embodiments of the present disclosure.

FIG. 8 illustrates an exemplary embodiment in which an island dam 162B is located between the first dam 610 and the second dam 620. Since the island dam 162B is used to provide a resistance to the flow of the material used to form the organic encapsulation layer 420 (see FIG. 2), even when the island dam 162B is disposed between the first dam 610 and the second dam 620, the island dam 162B still controls reflow of the material used to form the organic encapsulation layer 420 (see FIG. 2). The island dam 162B may be formed at the same time as the island dam 162 described with reference to FIG. 7.

Figure 9:
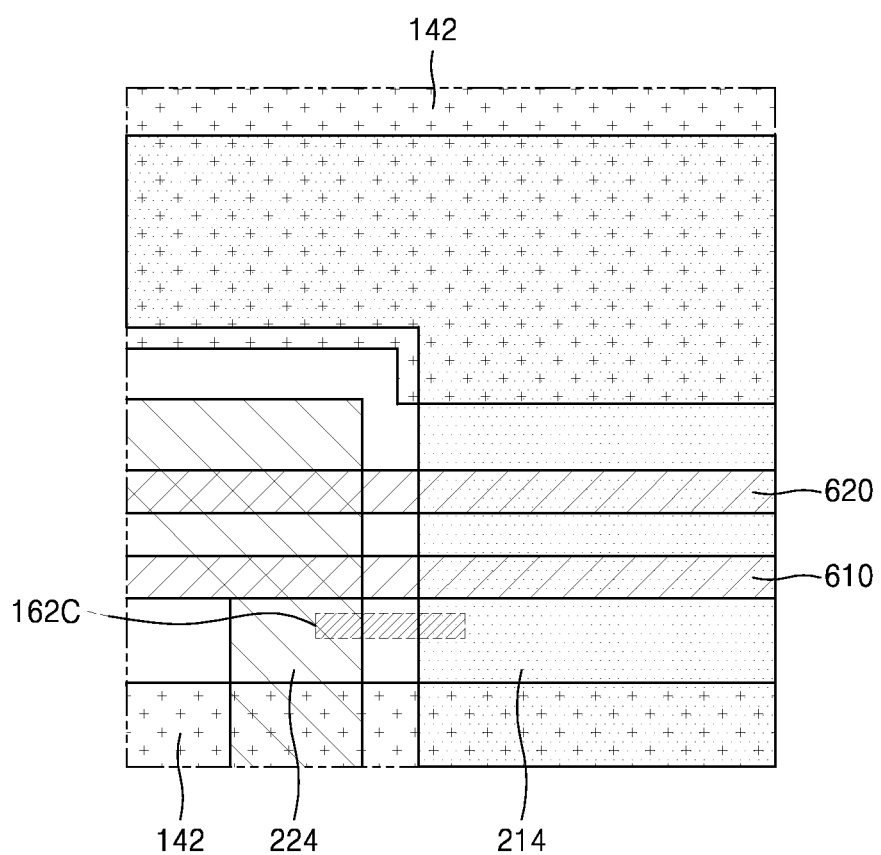

As shown in FIG. 9, in an exemplary embodiment, an island dam 162C is disposed at a location outside of the first dam 610. Similar to as described above, in an exemplary embodiment, even when provided outside of the first dam 610, the island dam 162C still controls the reflow of the material used to form the organic encapsulation layer 420 (see FIG. 2), and since the island dam 162C does not directly contact the first inorganic encapsulation layer 410 (see FIG. 2), the adhesive property of the first inorganic encapsulation layer 410 is not weakened. The island dam 162C may be formed at the same time as the island dam 162B of FIG. 8 or the island dam 162 described with reference to FIG. 7.

Figure 10:
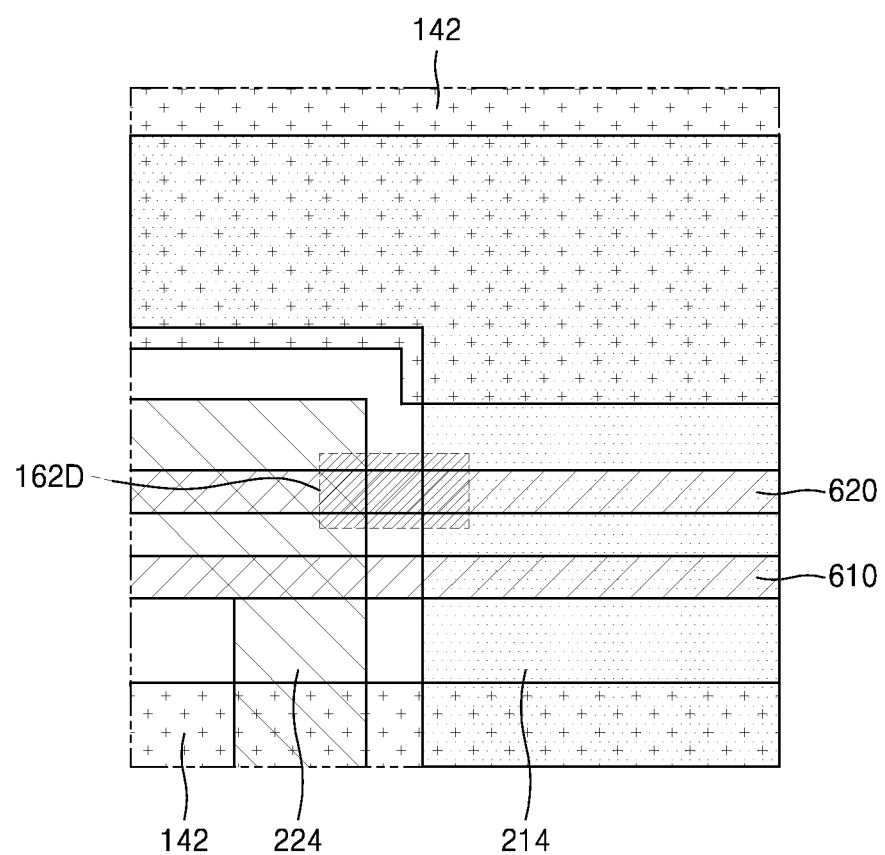
Figure 11:
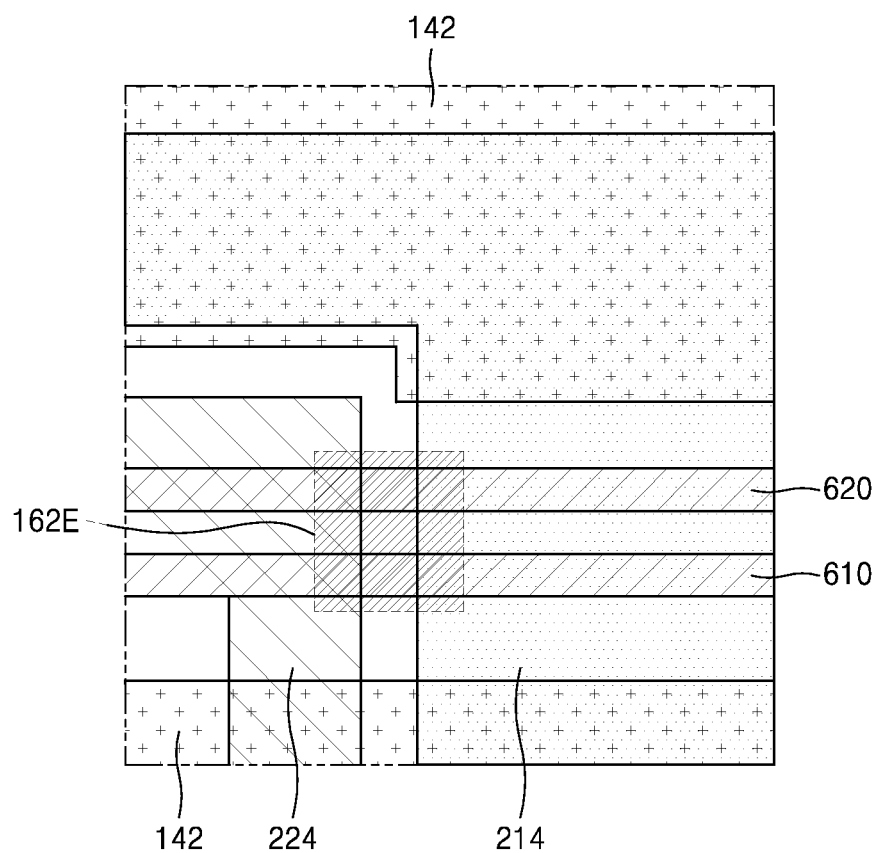

FIG. 10 shows an exemplary embodiment in which an island dam 162D is formed at a position overlapping the second dam 620. In an exemplary embodiment, when the island dam 162D overlaps the second dam 620, the height of the second dam 620 is partially increased at a part overlapping the island dam 162D. As a result, reflow of the material used to form the organic encapsulation layer 420 (see FIG. 2) may be more efficiently prevented. However, exemplary embodiments of the present disclosure are not limited thereto. For example, in an exemplary embodiment, the island dam 162D also overlaps the first dam 610. As another example, as illustrated in FIG. 11, in an exemplary embodiment, an island dam 162E is formed such that it simultaneously overlaps both the first dam 610 and the second dam 620. In this case, in an exemplary embodiment, the height of at least one of the first dam 610 and the second dam 620 increases in the overlapped area. For example, the height of at least one of the first dam 610 and the second dam 620 may be larger in an overlapped area (relative to the island dam 162E) than in a non-overlapped area (relative to the island dam 162E). In these exemplary embodiments, the island dam (e.g., 162D, 162E) may be disposed below the first dam 610 and the second dam 620.

According to exemplary embodiments of the present disclosure, by preventing edge tails from being formed at an organic encapsulation layer, moisture or oxygen from outside may be prevented from permeating into a display device.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:
1. A display device, comprising:
a substrate comprising a display area, a peripheral area disposed at a periphery of the display area, and a pad area disposed in the peripheral area;
a first voltage line disposed in the peripheral area between a first side of the display area and the pad area;

a second voltage line disposed at other sides of the display area; and an isolated dam disposed between the display area and the pad area, wherein the first voltage line comprises a first main voltage line and a first connection unit, wherein the first connection unit protrudes from the first main voltage line and extends toward the pad area, wherein the second voltage line comprises a second main voltage line and a second connection unit, wherein the second connection unit protrudes from the second main voltage line and extends toward the pad area, wherein the isolated dam extends substantially parallel to the first main voltage line, and wherein the isolated dam is disposed between the first connection unit and the second connection unit, a first end of the isolated dam overlaps the first connection unit, and a second end of the isolated dam that opposes the first end overlaps the second connection unit wherein the first end of the isolated dam comprises a first side surface connecting an upper surface of the isolated dam to a lower surface of the isolated dam, and the second end of the isolated dam comprises a second side surface opposing the first side surface and connecting the upper surface of the isolated dam to the lower surface of the isolated dam.

2. The display device of claim 1, wherein the island dam is disposed on a layer lower than the first voltage line and the second voltage line.

3. The display device of claim 1, further comprising:
a thin film transistor disposed in the display area;
a display element electrically connected to the thin film transistor;
a planarization insulating layer disposed between the thin film transistor and the display element;
a first dam disposed in the peripheral area; and
a second dam disposed in the peripheral area, wherein the first dam and the second dam are separate from the planarization insulating layer,
wherein the isolated dam overlaps at least one of the first dam and the second dam.

4. The display device of claim 3, wherein the isolated dam is disposed below the first dam and the second dam.

5. The display device of claim 1, further comprising:
a thin film transistor disposed in the display area;
a display element electrically connected to the thin film transistor;
an encapsulation layer sealing the display element; and
an inorganic protection layer disposed between the isolated dam and the encapsulation layer.

6. The display device of claim 5, wherein the encapsulation layer comprises:
a first inorganic encapsulation layer, an organic encapsulation layer, and a second inorganic encapsulation layer consecutively stacked,
wherein the first inorganic encapsulation layer directly contacts the inorganic protection layer at a position at which the first inorganic encapsulation layer overlaps the isolated dam.

7. The display device of claim 5, wherein the display area further comprises:
a data line that provides data signals to the thin film transistor, wherein the inorganic protection layer covers the data line.

8. The display device of claim 5, further comprising:
a planarization insulating layer disposed between the thin film transistor and the display element; and a first dam separate from the planarization insulating layer and surrounding the display area, wherein the inorganic protection layer covers the first connection unit and the second connection unit between the planarization insulating layer and the first dam.

9. The display device of claim 8,
wherein the encapsulation layer comprises a first inorganic encapsulation layer, an organic encapsulation layer, and a second inorganic encapsulation layer consecutively stacked,
wherein the first inorganic encapsulation layer and the second inorganic encapsulation layer contact each other outside the organic encapsulation layer, and the first inorganic encapsulation layer and the second inorganic encapsulation layer extend outside of the first dam.

10. The display device of claim 8, wherein the inorganic protection layer covers the isolated dam in an area exposed between the first connection unit and the second connection unit.

11. The display device of claim 1, further comprising:
a thin film transistor disposed in the display area;
a display element electrically connected to the thin film transistor;
a planarization insulating layer disposed between the thin film transistor and the display element;
a first dam disposed in the peripheral area; and
a second dam disposed in the peripheral area, wherein the first dam and the second dam are separate from the planarization insulating layer,
wherein the isolated dam is disposed between the display area and the second dam.

12. The display device of claim 1, further comprising:
a thin film transistor in the display area, and a display element electrically in contact with the thin film transistor, wherein
the display element further comprises a pixel electrode, an opposite electrode located to face the pixel electrode, and an intermediate layer located between the pixel electrode and the opposite electrode, the intermediate layer including an emission layer, and
the emission layer includes a quantum dot material.

13. The display device of claim 12, wherein
the quantum dot material comprises a core and a shell covering the core, and the core includes a material selected from among Group II-VI compounds, Group III-V compounds, Group IV-VI compounds, Group IV elements, Group IV compounds, and combinations thereof.

14. The display device of claim 1, wherein the isolated dam is disposed only between the display area and the pad area.

15. A display device, comprising:
a substrate comprising a display area, a peripheral area disposed at a periphery of the display area, and a pad area disposed in the peripheral area;
a first voltage line disposed in the peripheral area between a first side of the display area and the pad area;
a second voltage line disposed at other sides of the display area; and
an isolated dam disposed between the display area and the pad area,
wherein the first voltage line comprises a first main voltage line and a first connection unit, wherein the first connection unit protrudes from the first main voltage line and extends toward the pad area, wherein the second voltage line comprises a second main voltage line and a second connection unit, wherein the second connection unit protrudes from the second main voltage line and extends toward the pad area, wherein the isolated dam extends substantially parallel to the first main voltage line, and wherein the isolated dam is disposed between the first connection unit and the second connection unit, a first end of the isolated dam overlaps the first connection unit, and a second end of the isolated dam that opposes the first end overlaps the second connection unit, wherein the substrate further comprises a bending area disposed between the display area and the pad area, wherein an inorganic insulating layer stacked on the substrate comprises a groove formed at a position corresponding to the bending area, and an organic material layer is disposed in the groove, wherein the isolated dam comprises a same material as the organic material layer.

16. A display device, comprising:
a substrate comprising a display area, a peripheral area disposed at a periphery of the display area, and a pad area disposed in the peripheral area;
a first voltage line disposed in the peripheral area between a first side of the display area and the pad area;
a second voltage line disposed at other sides of the display area; and
an isolated dam disposed between the display area and the pad area, wherein the first voltage line comprises a first main voltage line and a first connection unit, wherein the first connection unit protrudes from the first main voltage line and extends toward the pad area, wherein the second voltage line comprises a second main voltage line and a second connection unit, wherein the second connection unit protrudes from the second main voltage line and extends toward the pad area, wherein the isolated dam extends substantially parallel to the first main voltage line, and wherein the isolated dam is disposed between the first connection unit and the second connection unit, a first end of the isolated dam overlaps the first connection unit, and a second end of the isolated dam that opposes the first end overlaps the second connection unit, wherein the first end of the isolated dam overlaps the first connection unit in a cross-sectional view, and the second end of the isolated dam opposes the first end in the cross-sectional view and overlaps the second connection unit in the cross-sectional view.

* * * * *